(12) United States Patent
Kato et al.

(10) Patent No.: US 9,277,639 B2
(45) Date of Patent: Mar. 1, 2016

(54) SEMICONDUCTOR CIRCUIT BOARD, SEMICONDUCTOR DEVICE USING THE SAME, AND METHOD FOR MANUFACTURING SEMICONDUCTOR CIRCUIT BOARD

(71) Applicants: Kabushiki Kaisha Toshiba, Tokyo (JP); Toshiba Materials Co., Ltd., Yokohama-shi, Kanagawa-ken (JP)

(72) Inventors: Hiromasa Kato, Nagareyama (JP); Masanori Hoshino, Yokohama (JP)

(73) Assignees: KABUSHIKI KAISHA TOSHIBA, Tokyo (JP); TOSHIBA MATERIALS CO., LTD., Yokohama-Shi (JP)

( * ) Notice: Subject to any disclaimer, the term of this patent is extended or adjusted under 35 U.S.C. 154(b) by 0 days.

(21) Appl. No.: 14/433,342

(22) PCT Filed: Oct. 1, 2013

(86) PCT No.: PCT/JP2013/076645
§ 371 (c)(1),
(2) Date: Apr. 2, 2015

(87) PCT Pub. No.: WO2014/054609
PCT Pub. Date: Apr. 10, 2014

(65) Prior Publication Data
US 2015/0257252 A1 Sep. 10, 2015

(30) Foreign Application Priority Data
Oct. 4, 2012 (JP) .................................. 2012-222239

(51) Int. Cl.
*H01L 23/48* (2006.01)
*H05K 1/02* (2006.01)
(Continued)

(52) U.S. Cl.
CPC ............ *H05K 1/0207* (2013.01); *C04B 37/026* (2013.01); *H01L 21/4857* (2013.01); *H01L 23/3735* (2013.01); *H01L 23/49822* (2013.01); *H01L 23/49838* (2013.01); *H01L 23/49866* (2013.01); *H01L 24/32* (2013.01); *H01L 24/83* (2013.01); *H05K 1/0306* (2013.01); *H05K 1/092* (2013.01); *C04B 2235/407* (2013.01); *C04B 2235/6581* (2013.01); *C04B 2235/96* (2013.01); *C04B 2235/9607* (2013.01);
(Continued)

(58) Field of Classification Search
CPC ...................................................... H05K 1/0207
USPC ......................................................... 257/773
See application file for complete search history.

(56) References Cited

FOREIGN PATENT DOCUMENTS

| JP | 2001-077253 | 3/2001 |
|----|-------------|--------|
| JP | 2004-172378 | 6/2004 |

(Continued)

*Primary Examiner* — Anthony Ho
(74) *Attorney, Agent, or Firm* — Foley & Lardner LLP

(57) ABSTRACT

The present invention provides a semiconductor circuit board in which a conductor portion is provided on an insulating substrate, wherein a surface roughness of a semiconductor element-mounting section of the conductor portion is 0.3 µm or lower in arithmetic average roughness Ra, 2.5 µm or lower in ten-point average roughness Rzjis, 2.0 µm or smaller in maximum height Rz, and 0.5 µm or lower in arithmetic average waviness Wa. Further, assuming that a thickness of the insulating substrate is t1 and a thickness of the conductor portion is t2, the thickness of t1 and t2 satisfy a relation: $0.1 \leq t2/t1 \leq 50$. Due to above structure, even if an amount of heat generation of the semiconductor element is increased, there can be provided a semiconductor circuit board and a semiconductor device having excellent TCT characteristics.

14 Claims, 4 Drawing Sheets

(51) Int. Cl.
  *H01L 23/373*  (2006.01)
  *C04B 37/02*  (2006.01)
  *H01L 23/498*  (2006.01)
  *H05K 1/03*  (2006.01)
  *H05K 1/09*  (2006.01)
  *H01L 25/07*  (2006.01)
  *H01L 23/15*  (2006.01)
  *H01L 21/48*  (2006.01)
  *H01L 23/00*  (2006.01)

(52) U.S. Cl.
  CPC .... *C04B 2237/125* (2013.01); *C04B 2237/127* (2013.01); *C04B 2237/343* (2013.01); *C04B 2237/366* (2013.01); *C04B 2237/368* (2013.01); *C04B 2237/704* (2013.01); *C04B 2237/86* (2013.01); *H01L 21/4807* (2013.01); *H01L 23/15* (2013.01); *H01L 24/29* (2013.01); *H01L 25/072* (2013.01); *H01L 2224/29124* (2013.01); *H01L 2224/29139* (2013.01); *H01L 2224/29147* (2013.01); *H01L 2224/32225* (2013.01); *H01L 2224/83801* (2013.01); *H01L 2924/01322* (2013.01); *H01L 2924/1033* (2013.01); *H01L 2924/10253* (2013.01); *H01L 2924/10272* (2013.01); *H01L 2924/1305* (2013.01); *H01L 2924/13055* (2013.01); *H05K 2201/0929* (2013.01)

(56) References Cited

FOREIGN PATENT DOCUMENTS

| | | |
|---|---|---|
| JP | 3797905 B2 | 7/2006 |
| JP | 2006-278595 | 10/2006 |
| JP | 2008-117833 | 5/2008 |
| WO | WO-2007/105361 | 9/2007 |

SEMICONDUCTOR CIRCUIT BOARD, SEMICONDUCTOR DEVICE USING THE SAME, AND METHOD FOR MANUFACTURING SEMICONDUCTOR CIRCUIT BOARD

TECHNICAL FIELD

The present invention relates to a semiconductor circuit board, a semiconductor device using the semiconductor circuit board, and a method for manufacturing the semiconductor circuit board.

BACKGROUND ART

Semiconductor chips (semiconductor elements) used for electronic control have been increasingly reduced in size, and the amount of heat generation from the chips grows steadily. Accordingly, it is important to improve heat dissipation in a semiconductor circuit board (including a module) mounted with semiconductor chips. The reason for this is that if a semiconductor chip exceeds the intrinsic temperature thereof even at only one point of the chip, the resistance of the chip changes to a negative-side temperature coefficient. This change causes a thermal runaway in which a power current flows intensively, thus instantaneously destroying the chip. That is, there is a demand for making heat dissipation designs in consideration of margins consistent with the electrical power loss of chips.

Thermal resistance (Rth) can be expressed by the formula $Rth=L/(k\times A)$. In the formula, Rth is thermal resistance, L is a heat transfer path, k is thermal conductivity, and A is a heat dissipation area. According to this formula, the thermal resistance (Rth) becomes lower with a decrease in the heat transfer path (L) and an increase in the thermal conductivity (k) and the heat dissipation area (A). Note that in general, the heat transfer path (L) corresponds to the thickness of a circuit board.

A commonly-known semiconductor device using a semiconductor chip involves contact among dissimilar materials, where the heat transfer path of the semiconductor device is represented as chip→solder→electrode circuit material→insulating substrate→back-side metal plate→solder→heat-dissipating member (heat sink). These heat mediums, except the heat-dissipating member, belong to an insulating circuit board. That is, the performance improvement of the semiconductor device cannot be achieved unless the insulating circuit board which accounts for most of the heat transfer path is superior in heat dissipation performance.

An Si chip which is the mainstream of current semiconductor chips has encountered its limit of response speed. Accordingly, the development of chips using SiC and GaN as next-generation semiconductor elements is moving ahead at a fast pace as a national project, with the aim of further downsizing equipment and improving the performance thereof. An SiC chip, in particular, is said to be usable at a temperature of up to 600° C., whereas the operable temperature of the mainstream of Si chips is 125 to 150° C. Thus, in addition to fast response speed, high operating temperature is another characterizing feature of the SiC chip.

If a conventional solder material is used to bond the chip and an electrode circuit material, however, the operating temperature decreases to the melting point of the solder material or lower. It is therefore not considered possible to take advantage of the chip's feature of being high in operating temperature. Under the current circumstances where a high-melting point solder material is being developed, any solder materials having a melting point of 600° C. or higher and sufficient reliability have not yet developed. A pamphlet of International Publication No. WO2007/105361 (Patent Document 1), for example, proposes using an Ag—Cu brazing material in place of high-melting point solder materials. It has been confirmed that use of such a high-melting point brazing material having a junction temperature of 600° C. or higher as described in Patent Document 1 enhances the reliability of junction (bonding) between the electrode circuit material and the semiconductor element to a certain degree.

On the other hand, attempts are being made to not only enhance the reliability of the junction but also further improve heat dissipation. For example, studies are being made of a method for directly bonding the semiconductor chip to the electrode circuit material without the interposition of any jointing materials, such as a brazing material, and a method for dissipating heat not only in a latitudinal direction but also in a lateral direction by thickening the electrode circuit material. In addition, whereas a single-sided cooling method in which a semiconductor chip is joined (bonded) to a heat sink through an insulating circuit board is the mainstream in a conventional semiconductor circuit board module, a double-sided cooling method or the like in which the semiconductor chip is cooled from both sides thereof has been put in use.

PRIOR ART DOCUMENTS

Patent Documents

Patent Document 1: Pamphlet of International Publication No. WO2007/105361
Patent Document 2: Japanese Patent No. 3797905

SUMMARY OF THE INVENTION

Problems to be Solved by the Invention

As described above, attempts on various improvements in a heat-dissipating structure are being made in preparation for a rise in the operating temperature of semiconductor elements. A method for directly bonding (joining) a semiconductor chip to an electrode circuit material without the interposition of any bonding materials, such as a brazing material, leads to the shortening of a heat transfer path (L).

In addition, a method for dissipating heat not only in a latitudinal direction but also in a lateral direction by thickening the electrode circuit material leads to an increase in a heat dissipation area (A). A double-sided cooling method in which the semiconductor chip is cooled from both sides thereof also leads to an increase in the heat dissipation area (A).

There has been such a problem, however, in which there are no semiconductor circuit boards suited for various methods of thermal resistance reduction which may lead to the further improvement of heat dissipation (heat radiating property).

The present invention is intended to cope with such a problem and provide a semiconductor circuit board superior in heat dissipation.

Means for Solving the Problems

A semiconductor circuit board of the present invention in which a conductor portion is provided on an insulating substrate (board) is characterized in that a surface roughness of a semiconductor element-mounting section of the conductor portion is 0.3 μm or lower in arithmetic average roughness Ra, 2.5 μm or lower in ten-point average roughness Rzjis, 2.0 μm or smaller in maximum height Rz, and 0.5 µm or lower in arithmetic average waviness Wa.

Assuming that a thickness of the insulating substrate is t1 and a thickness of the conductor portion is t2, it is preferable to satisfy a relation: $0.1 \leq t2/t1 \leq 50$. In addition, the cross-sectional angle of a lateral-side edge of the conductor portion is preferably 45° or smaller. Yet additionally, the conductor portion is preferably made of a metal plate, whereas the insulating substrate is preferably made of a ceramic substrate, and a protruding region (width) of a bonding layer for bonding the metal plate and the ceramic substrate, protruding from the metal plate is preferably 0.2 mm or smaller. Still additionally, the insulating substrate is preferably composed of one of an alumina substrate, an aluminum nitride substrate, a silicon nitride substrate, and an insulating resin substrate. Still additionally, the conductor portion is preferably composed of one of copper, copper alloy, aluminum, and aluminum alloy.

A semiconductor device according to the present invention is characterized in that a semiconductor element is mounted on a conductor portion of a semiconductor circuit board of the present invention. The semiconductor element is preferably composed of one or more than one element selected from the group consisting of an Si element, a GaN element, and an SiC element. In addition, the semiconductor element is preferably bonded to the conductor portion through a jointing material interposed therebetween. Alternatively, it is also preferable that the semiconductor element is directly bonded to the conductor portion without the bonding material interposed therebetween.

A method for manufacturing a semiconductor circuit board of the present invention comprises: a conductor portion formation step of forming a conductor portion on an insulating substrate; and a surface treatment step of setting the surface roughness of a semiconductor element-mounting section (surface) of the conductor portion to 0.3 µm or lower in arithmetic average roughness Ra, 2.5 µm or lower in ten-point average roughness Rzjis, 2.0 µm or smaller in maximum height, and 0.5 µm or lower in arithmetic average waviness Wa.

The surface treatment step is preferably a polishing step. Alternatively, the polishing step is preferably an etching step. Yet alternatively, the polishing step is preferably a pressing process.

Advantages of the Invention

The semiconductor circuit board of the present invention is significantly improved in the planarity of a semiconductor element-mounting section of a conductor portion and is, therefore, superior in heat dissipation. In addition, a semiconductor device mounted with a semiconductor element can be improved in heat dissipation. Yet additionally, the semiconductor circuit board, when mounted with a semiconductor element, is applicable to both a case in which a bonding material is used and a case in which the bonding material is not used.

DESCRIPTION OF EMBODIMENTS

A semiconductor circuit board according to the present invention in which a conductor portion is provided on an insulating substrate is characterized in that the surface roughness of a semiconductor element-mounting section of the conductor portion is 0.3 µm or lower in arithmetic average roughness Ra, 2.5 µm or lower in ten-point average roughness Rzjis, 2.0 µm or smaller in maximum height Rz, and 0.5 µm or lower in arithmetic average waviness Wa.

Figure 1:
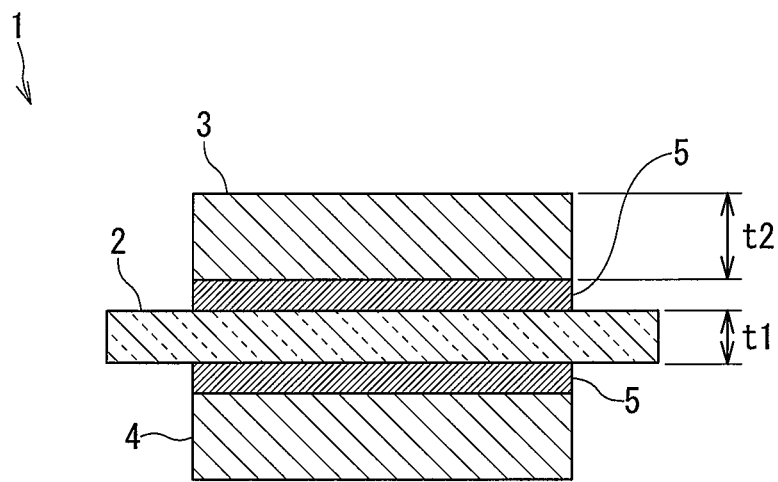
FIG. 1 is a cross-sectional view illustrating one embodiment of a semiconductor circuit board according to the present invention.

FIG. 1 illustrates one embodiment of the semiconductor circuit board of the present invention. In FIG. 1, reference numeral 1 denotes the semiconductor circuit board, reference numeral 2 denotes the insulating substrate, reference numeral 3 denotes 3 the conductor portion, reference numeral 4 denotes another conductor portion (back-side (rear) conductor portion), and reference numeral 5 denotes a bonding layer (junction layer) between the insulating substrate and the conductor portion.

The insulating substrate is not limited in particular, as long as insulation between the conductor portion 3 and the conductor portion 4 disposed on both sides of the substrate can be secured. Preferably, however, the insulating substrate is composed of one of an alumina substrate, an aluminum nitride substrate, a silicon nitride substrate and an insulating resin substrate. Since all of the alumina substrate, the aluminum nitride substrate, the silicon nitride substrate and the insulating resin substrate have excellent insulating properties, these substrates are still usable even if thinned to a substrate thickness of 1.5 mm or smaller. Among these substrates, the silicon nitride substrate is preferred. A silicon nitride substrate having a three-point bending strength of 500 MPa or higher and a thermal conductivity of 50 W/m·K or higher, and therefore, superior in both strength and thermal conductivity has been developed, as described in, for example, Japanese Patent No. 3797905 (Patent Document 2).

Like an SiC element to be described later, the silicon nitride substrate, even if subjected to operating temperatures as high as 200° C. or higher, exhibits excellent durability. Substrates for use under a high temperature of 200° C. or above are not limited to the silicon nitride substrate. Ceramic substrates, such as an alumina substrate and an aluminum nitride substrate, are also preferred since the substrates are superior in heat resistance.

The conductor portion is preferably composed of one of copper, copper alloy, aluminum and aluminum alloy. These metals are superior in electrical conductivity and are therefore preferred. These metals are high in thermal conductivity and are, therefore, also superior in heat dissipation. In addition, the conductor portion is preferably a metal plate made from one of copper, copper alloy, aluminum and aluminum alloy.

Yet additionally, the conductor portion 3 and the conductor portion 4 are preferably bonded to the insulating substrate 2 through the bonding layers 5.

The conductor portion may be bonded to the insulating substrate without the bonding layer interposed therebetween. If a ceramic substrate is used as the insulating substrate as described above, it is possible to apply such a bonding method as an active-metal bonding method using a brazing material or a direct bonding method not using the brazing material.

The semiconductor circuit board of the present invention is characterized in that the surface roughness of a semiconductor element-mounted section of the conductor portion is 0.3 µm or lower in arithmetic average roughness Ra, 2.5 µm or lower in ten-point average roughness Rzjis, 2.0 µm or smaller in maximum height Rz, and 0.5 µm or lower in arithmetic average waviness Wa.

Note that the abovementioned arithmetic average roughness Ra, ten-point average roughness Rzjis, maximum height Rz of 2.0 µm or smaller, and arithmetic average waviness Wa comply with the Japanese Industrial Standard (JIS) of JIS-B-0601 (2001). The maximum height Rz in JIS-B-0601 (2001) corresponds to Ry in JIS-B-0601 (1994). Likewise, the ten-point average roughness Rzjis in JIS-B-0601 (2001) corresponds to Rz in JIS-B-0601 (1994).

The surface roughness of the a semiconductor element-mounted section of the conductor portion which is defined as 0.3 µm or lower in arithmetic average roughness Ra, 2.5 µm or lower in ten-point average roughness Rzjis, 2.0 µm or smaller in maximum height Rz, and 0.5 µm or lower in arithmetic average waviness Wa signifies that the planarity of the semiconductor element-mounting section of the conductor portion is extremely superior.

As will be described later, the amount of heat generation is anticipated to increase due to an increase in the performance of semiconductor elements. For example, efforts are being made to raise the junction temperature of an Si element to as high as 150 to 170° C. In addition, the junction temperature of a GaN element or an SiC element is anticipated to increase to 300 to 400° C.

The actual operating temperature of each element, though lower than the junction temperature thereof, tends to be higher than the operating temperature of commonly-known Si elements.

If the amount of heat generation of the semiconductor element increases, the conductor portion becomes distorted due to thermal expansion. If the planarity of the semiconductor element-mounting section of the conductor portion is inferior at this time, the semiconductor element suffers problems, such as displacement or delamination, when the conductor portion becomes distorted.

In the present invention, the semiconductor circuit board is extremely superior in the planarity of the semiconductor element-mounting section of the conductor portion. Accordingly, even if the distortion of the conductor portion due to thermal expansion occurs, the distortion can be made uniform to prevent the displacement or delamination of the semiconductor element.

In addition, the semiconductor circuit board is improved in adhesion between the conductor portion and the semiconductor element. Accordingly, it is possible to prevent any unreacted portions and gaps (non-bonded portions), which may develop as defects in a junction between the conductor portion and the semiconductor element, from being produced. Unreacted portions and gaps can also be prevented from being produced when the conductor portion and the semiconductor element are bonded through a bonding material.

The surface roughness of the semiconductor element-mounting section of the conductor portion is preferably 0.1 µm or lower in arithmetic average roughness Ra, 2.0 µm or lower in ten-point average roughness Rzjis, 1.2 µm or smaller in maximum height Rz, and 0.1 µm or lower in arithmetic average waviness Wa.

In addition, assuming that the thickness of the insulating substrate is t1 and the thickness of the conductor portion is t2, it is preferable that t1 and t2 satisfy a relation: $0.1 \leq t2/t1 \leq 50$. As will be described later, semiconductor elements are available in a variety of types, including an Si element, a GaN element and an SiC element. In either case, the amount of heat generation tends to increase due to an increase in output power.

In order to efficiently dissipate heat generated by a semiconductor element, the conductor portion high in thermal conductivity preferably has a certain thickness. The thickness preferably satisfies $t1 \leq 1.5$ mm and, more preferably, satisfies $0.1 \text{ mm} \leq t1 \leq 0.8 \text{ mm}$.

A thickness t1 of the insulating substrate smaller than 0.1 mm may fail to ensure insulation between the conductor portion 3 and the conductor portion 4. On the other hand, a thickness t1 of the insulating substrate t1 larger than 1.5 mm causes the insulating board itself to serve as a thermal resistive element, thus degrading the heat dissipation of the semiconductor circuit board. In addition, the thickness t2 of the conductor portion preferably satisfies $1 \leq t2/t1 \leq 10$. The back surface-side conductor portion (conductor portion 4) also preferably has the same thickness relationship as the insulating substrate.

Figure 2:
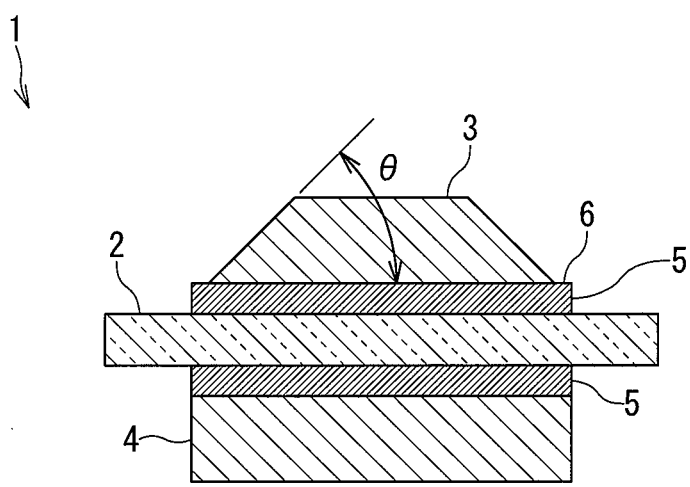
FIG. 2 is a cross-sectional view illustrating another embodiment of the semiconductor circuit board according to the present invention.

The cross-sectional angle of a lateral-side edge of the conductor portion is preferably 45° or smaller. FIG. 2 illustrates one example of the semiconductor circuit board in which a lateral-side edge of the conductor portion is angled. In FIG. 2, reference numeral 1 denotes the semiconductor circuit board, reference numeral 2 denotes the insulating substrate, reference numeral 3 denotes the conductor portion, reference numeral 4 denotes another conductor portion (back-side conductor portion), reference numeral 5 denotes a bonding layer (junction layer) between the insulating substrate and the conductor portion, reference numeral 6 denotes a protruding region (width) of the bonding layer, and θ denotes the angle of a lateral-side edge of the conductor portion.

As described earlier, the conductor portion becomes distorted due to thermal expansion if the amount of heat generation of the semiconductor element increases. At this time, the distortion of the lateral-side edge of the conductor portion due to thermal expansion can be reduced if the cross-sectional angle θ of the lateral-side edge of the conductor portion is decreased to 45° or smaller. If the distortion of the lateral-side edge of the conductor portion can be reduced, it is possible to prevent the insulating substrate and the conductor portion from delamination (peeling-off).

Yet additionally, the conductor portion is, preferably made of a metal plate, whereas the insulating substrate is preferably made of a ceramic substrate, and the region (width) of a bonding layer for bonding the metal plate and the ceramic substrate protruding from the metal plate is preferably 0.2 mm or smaller. The protruding region 6 of the bonding layer is a portion thereof protruding from the lateral-side edge of the metal plate in a bonding face between the ceramic substrate and the metal plate.

By providing the protruding region 6 of the bonding layer, it is possible to prevent the delamination of the ceramic substrate from a bonding edge face of the metal plate. A width of the protruding region 6 larger than 0.2 mm does not provide any further effect of preventing delamination, but can be a cause for cost increases instead. It is more effective to combine this technique with the above-described technique of setting the cross-sectional angle of the lateral-side edge of the conductor portion to 45° or smaller. This combined technique is particularly effective when the semiconductor circuit board is provided with a thick conductor portion having a thickness t2 of 2 mm or larger.

Figure 3:
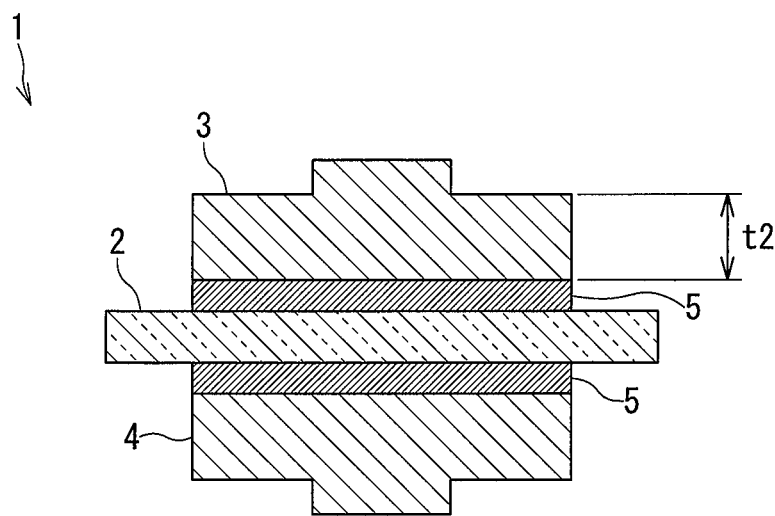
FIG. 3 is a cross-sectional view illustrating yet another embodiment of the semiconductor circuit board according to the present invention.
Figure 4:
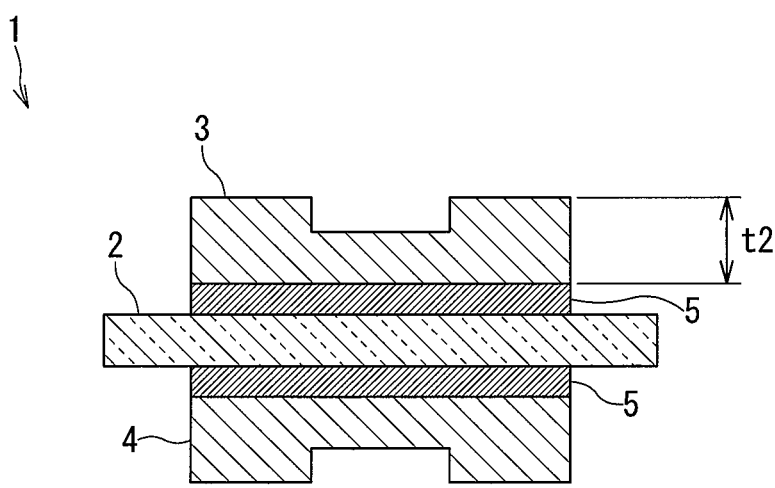
FIG. 4 is a cross-sectional view illustrating still another embodiment of the semiconductor circuit board according to the present invention.

FIGS. 3 and 4 illustrate another embodiment of the semiconductor circuit board of the present invention. In the figures, reference numerals and characters are the same as those shown in FIG. 1. FIG. 3 illustrates a conductor portion 3 formed into a convex shape, whereas FIG. 4 illustrates the conductor portion 3 formed into a concave shape. In FIG. 3, a semiconductor element-mounting section of the conductor portion may be the highest location of a convex surface or a step portion thereof.

In FIG. 4, a semiconductor element-mounting section of the conductor portion may be the lowest location or the highest location of a concave surface. In either case, the semiconductor element-mounting section is processed to have a planar surface having the surface roughness of 0.3 μm or lower in arithmetic average roughness Ra, 2.5 μm or lower in ten-point average roughness Rzjis, 2.0 μm or smaller in maximum height, and 0.5 μm or lower in arithmetic average waviness Wa.

Such a convex conductive portion as illustrated in FIG. 3 allows the thermal expansion of edges of the conductive portion to be relieved by mounting a semiconductor element in the highest location of the convex surface of the conductive portion. It is therefore possible to prevent the insulating substrate and the conductive portion from delamination.

In addition, such a concave conductive portion as illustrated in FIG. 4 allows the heat of the semiconductor element to be efficiently dissipated through the conductor portion by mounting the semiconductor element in the lowest location of the recessed portion of the conductive portion.

Note that in the case of such a convex conductor portion as illustrated in FIG. 3, the thickness t2 of the conductor portion refers to the thickness of the thickest location of the conductor portion. Also in the case of such a concave conductor portion as illustrated in FIG. 4, the thickness t2 of the conductor portion refers to the thickness of the thickest location of the conductor portion.

In the semiconductor circuit board described above, the semiconductor element-mounting section of the conductor portion has superior planarity. Accordingly, the distortion of the conductor portion can be prevented even if the amount of heat generation of the semiconductor element increases. It is therefore possible to prevent the semiconductor element from problems, such as delamination. Consequently, a semiconductor device which uses the semiconductor circuit board of the present invention can be improved in reliability.

Various semiconductor elements, including Si elements, GaN elements, SiC elements and thermoelectric elements, can be used for the semiconductor device. In particular, the semiconductor element is preferably composed of one or more than one of the Si element, the GaN element and the SiC element, among these elements. Efforts are being made to raise the junction temperature of the Si element to as high as 150 to 170° C. In addition, the junction temperature of the GaN element or the SiC element is anticipated to increase to 300 to 400° C. The operating temperature of all of these semiconductor elements tends to increase to 130° C. or higher, and even to 200° C. or higher.

The semiconductor circuit board of the present invention is improved in the planarity of the semiconductor element-mounting section. Accordingly, the positional displacement of a semiconductor element can be prevented even if operating temperature rises. It is therefore possible to apply both a method for joining semiconductor element to, the conductive portion through a jointing material and a method for directly joining semiconductor elements to the conductive portion without the jointing material interposed therebetween.

Figure 5:
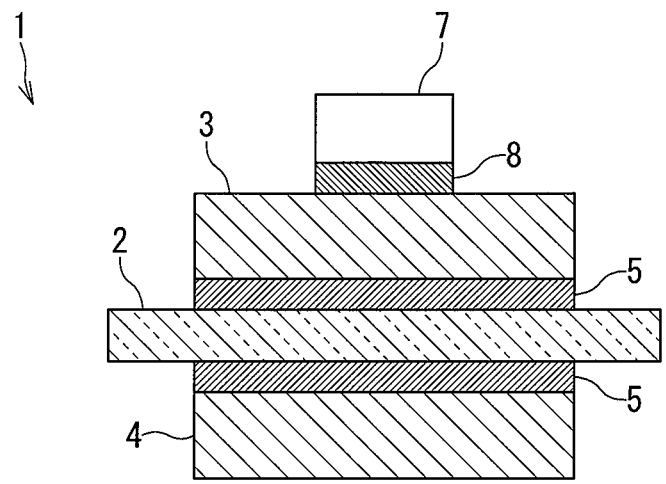
FIG. 5 is a cross-sectional view illustrating one embodiment of a semiconductor device according to the present invention.
Figure 6:
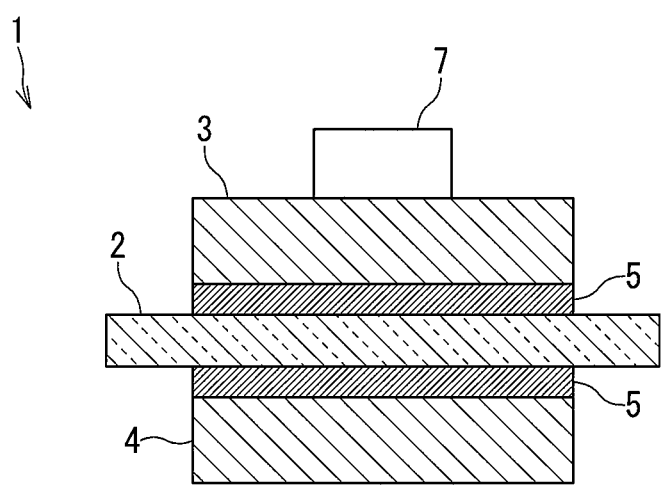
FIG. 6 is a cross-sectional view illustrating another embodiment of the semiconductor device according to the present invention.

FIG. 5 illustrates one embodiment of a semiconductor device mounted with a semiconductor element 7 through a bonding layer 8. FIG. 6 illustrates one embodiment of a semiconductor device mounted with a semiconductor element 7 without the bonding layer 8 interposed therebetween. In FIGS. 5 and 6, reference numeral 1 denotes the semiconductor circuit board (semiconductor device), reference numeral 2 denotes the insulating substrate, reference numeral 3 denotes the conductor portion, reference numeral 4 denotes another conductor portion (back-side conductor portion), reference numeral 5 denotes a bonding layer between the insulating substrate and the conductor portion, reference numeral 7 denotes a semiconductor element, and reference numeral 8 denotes a bonding layer for bonding the semiconductor element.

Examples of bonding materials in a case where a structure in which the semiconductor element is bonded to the conductive portion through the bonding material is adopted include solder, an active-metal brazing material, and thermally-conductive resin.

For the solder, lead-free solder is preferred, and the solder preferably has a melting point higher by 100° C. or more than the operating temperature of the semiconductor element.

The active-metal brazing material is an Ag—Cu alloy brazing material containing at least one active metal selected from the group consisting of Ti, Zr and Hf. The active-metal brazing material is preferably composed of 1 to 6% by mass of active metal, 10 to 35% by mass of Cu, and Ag for the rest, and 10 to 20% by mass of In or Sn may be added as necessary. The active-metal brazing material has a melting point as high as 700° C. or higher, and therefore, can maintain a strongly bonded state even if the operating temperature of the semiconductor element rises to as high as 200° C. or higher.

On the other hand, examples of a method for adopting a structure in which the semiconductor element is directly joined to the conductor portion without the jointing material interposed therebetween include a pressure bonding method, a friction stir welding (FSW) method and a normal temperature bonding method.

The abovementioned pressure bonding method is a method for bringing the semiconductor element into contact with the semiconductor element-mounting section of the conductor portion and pressing the semiconductor element into the section with a certain pressure to bond the semiconductor element. The semiconductor element may be bonded by pressing in the semiconductor element with a certain pressure while applying heat as necessary. Alternatively, the semiconductor element may be bonded by irradiating the bonding face of the semiconductor element with Ar beams or the like in a vacuum and thereby surface-activating the bonding face.

The friction stir welding method (FSW) is a method for bonding the semiconductor element by pressuring and pressing the semiconductor element against the semiconductor circuit board, while rotating either one of the semiconductor element and the semiconductor circuit board, thereby bonding the semiconductor element by means of frictional heat and stirring force. This method takes advantage of frictional heat and stirring force, and therefore, enables solid-phase junction based on a plastic flow, without melting a base material.

The above-described pressure bonding method, friction stir welding method and normal temperature bonding method directly bond the semiconductor element and the conductor portion without using any bonding materials, as described above, and therefore, do not cause any bonding failure due to the delamination of a bonding material. In addition, since the semiconductor element is directly bonded to the conductor portion, the semiconductor circuit board is superior in heat dissipation even if the amount of heat generation of the semiconductor element increases.

Figure 7:
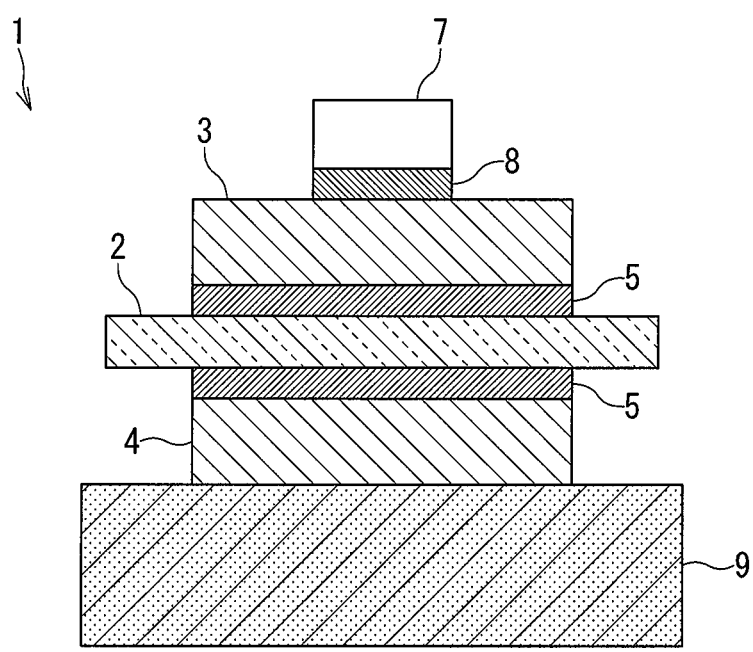
FIG. 7 is a cross-sectional view illustrating yet another embodiment of the semiconductor device according to the present invention.

FIG. 7 illustrates a semiconductor device (semiconductor circuit board) to which a heat sink is joined (bonded). In FIG. 7, reference numeral 1 denotes the semiconductor circuit board, reference numeral 2 denotes the insulating substrate, reference numeral 3 denotes the conductor portion, reference numeral 4 denotes another conductor portion (back-side conductor portion), reference numeral 5 denotes a bonding layer between the insulating substrate and the conductor portion, reference numeral 7 denotes a semiconductor element, reference numeral 8 denotes a bonding layer for bonding the semiconductor element, and reference numeral 9 denotes a heat sink. By bonding the heat sink 9 to the back-side conductor portion 4, it is possible to further improve heat dissipating property.

The semiconductor device of the present invention can maintain the reliability of bonding (junction) between the semiconductor element and the conductor portion, while maintaining excellent heat dissipation, even if the amount of heat generation of the semiconductor element increases.

In addition, the TCT (thermal cycle test) characteristics of the conductive portion and the insulating substrate are improved by adjusting the shape of side-surface edges of the conductive portion and the amount of protrusion of the bonding layer between the conductive portion and the insulating substrate. Thus, it is possible to prevent the occurrence of the problem of delamination.

Consequently, the TCT characteristics of the semiconductor device are significantly improved, thus making it possible to improve the reliability of the semiconductor device. Accordingly, the semiconductor device can be applied to a variety of fields, including a power control unit (PCU), an IGBT (insulated-gate bipolar transistor), and an IPM (intelligent power module) used in automobiles, electric vehicles, electric railroad cars, industrial machinery, and inverters for air-conditioners and the like.

Next, a manufacturing method will be described. Although the method for manufacturing the semiconductor circuit board of the present invention is not limited in particular, the below-described method is available as a method for efficiently obtaining a circuit board.

First, an insulating substrate is prepared. Examples of the insulating substrate include a ceramic substrate and an insulating resin substrate. As the ceramic substrate, an alumina substrate, an aluminum nitride substrate, or a silicon nitride substrate is preferred. The alumina substrate ($Al_2O_3$), though 10 to 30 W/m·K in thermal conductivity, has a three-point bending strength of as high as 400 MPa or higher. In addition, the alumina substrate is inexpensive, compared with the aluminum nitride substrate and the silicon nitride substrate, and is therefore effective in reducing costs. The aluminum nitride (AlN) substrate preferably has a thermal conductivity of 170 W/m·K or higher. The aluminum nitride substrate has a three-point bending strength of 250 MPa or higher, which is low compared with the alumina substrate, but can be increased in strength to 350 to 550 MPa by improving a sintering additive component or the like. The silicon nitride ($Si_3N_4$) substrate is preferably high in thermal conductivity and strength, having a thermal conductivity of 50 W/m·K or higher and a three-point bending strength of 500 MPa or higher.

The insulating resin substrate is not limited in particular, as long as insulating properties are ensured. The insulating resin substrate is inexpensive, compared with the ceramic substrate. A selection of the insulating substrate is made according to the amount of heat generation of a semiconductor element to be mounted and the environment of usage by application. For example, the ceramic substrate is preferred if the element generates high heat as an SIC element. The silicon nitride substrate, in particular, can be thinned to a substrate thickness of 0.4 mm or smaller by making the substrate high in thermal conductivity and strength. Since the silicon nitride substrate can be prevented from serving as a thermal resistive element by reducing the substrate thickness, it is possible to further improve heat dissipation. In addition, the insulating substrate is preferably 1.5 mm or smaller, and more preferably 0.1 to 1.0 mm, in thickness.

Next, a step of providing a conductor portion in the insulating substrate is carried out. Examples of the conductor portion include a metal plate, a conductor made by calcinating (sintering) metal powder paste, a metal-deposited film, such as a sputtered film, and a metal-plated film. Among these materials, the metal plate is preferred. The metal plate makes it easy to adjust a ratio between the thickness t2 of the metal plate and the thickness t1 of the insulating substrate.

For bonding (junction) operation between the metal plate and the insulating substrate, a direct bonding copper method (DBC method) or an active-metal brazing material method is preferred, if the insulating substrate is a ceramic substrate. A bonding method using an adhesive agent or the like can be cited as an example, if the insulating substrate is an insulating resin substrate.

If the conductor portion to be mounted with the semiconductor element is formed into such a convex conductor portion as illustrated in FIG. 3 or such a concave conductor portion as illustrated in FIG. 4, a convex metal plate or a concave metal plate may be used previously, or the conductor portion may be shaped by etching or press work as will be described later.

A circuit geometry (circuit pattern) is imparted to the conductive portion, as necessary, by means of etching or press work. In addition, the shape of lateral-side edges of the conductor portion and the protruding region (width) of the bonding layer are adjusted by means of etching.

After the insulating substrate to which the conductor portion is bonded is prepared, polishing processing is performed to improve the planarity of a semiconductor element-mounting section of the conductor portion. Polishing processing for improving the planarity is etching or press work. Polishing processing for the purpose of obtaining a planar surface 0.3 μm or lower in arithmetic average roughness Ra, 2.5 μm or lower in ten-point average roughness Rzjis, 2.0 μm or smaller in maximum height, and 0.5 μm or lower in arithmetic average waviness Wa differs in conditions from etching or press work for the purpose of adding the abovementioned circuit geometry (circuit pattern).

That is, in the case of processing for the purpose of adjusting the circuit geometry, unnecessary portions of the conductor portion need to be removed completely. In contrast, polishing processing for the purpose of improving the planarity does not completely remove the conductor portion, but processes only the semiconductor element-mounting section into an intended planar surface. The planar surface is formed by removing a 1 to 50 μm-thick upper portion of the conductor portion.

In particular, if the semiconductor element is mounted by the above-described method not involving the interposition a jointing material, the semiconductor element-mounted section of the conductor portion is preferably 0.1 μm or lower in arithmetic average roughness Ra, 2.0 μm or lower in ten-point average roughness Rzjis, 1.2 μm or smaller in maximum height Rz, and 0.1 μm or lower in arithmetic average waviness Wa. Accordingly it is desirable to remove the conductor portion to a depth of 10 μm or deeper.

In the case of etching, an etching liquid and treatment conditions, such as immersion time or flow time, are selected according to the material of the conductor portion and the required degree of planarity. In the case of press work, a surface of a press die formed into an intended planar surface is pressurized against the conductor portion in a vacuum, while heating the die at 700 to 860° C., thus performing press work.

By forming only the semiconductor element-mounting section of the conductor portion into a planar surface, it is possible to obtain a marking effect of making it easy to identify a location to be mounted with the semiconductor element. Needless to say, the entire surface of the conductor portion may be formed into a planar surface, though the semiconductor element-mounted section of the conductor portion has only to be formed into a planar surface.

Next, a step of mounting a semiconductor element on an obtained semiconductor circuit board is carried out as a method for manufacturing a semiconductor device. As described earlier, a bonding operation between the semiconductor element and the semiconductor element-mounting section of the conductive portion may be performed by either a method involving the interposition of a bonding material or a method not involving the interposition of the bonding material.

Examples of the bonding materials in a case where a structure in which the semiconductor element is joined to the conductive portion through a bonding material is adopted include solder, an active-metal brazing material, and thermally-conductive resin. This bonding material is preferably as thin as 30 μm or thinner, and more preferably as thin as 10 μm or thinner. By thinning the bonding material, it is possible to make it more effective to form the semiconductor element-mounting section into a planar surface.

Assuming that a sum of metallic constituents is 100 wt (mass) %, the active-metal brazing material used to bond the semiconductor element is preferably composed of 1 to 6 wt % of Ti, 10 to 35 wt % of Cu, 10 to 20 wt % of one of Sn and In or both thereof, and Ag for the rest. The eutectic temperature of the active-metal brazing material can be lowered by adding one of Sn and In or both thereof to an active-metal brazing material composed of Ag—Cu—Ti.

By lowering the eutectic temperature of the active-metal brazing material, it is possible to raise the bonding temperature to 650 to 800° C. In a case where a ceramic substrate and a copper plate are bonded, the bonding temperature of the active-metal brazing material composed of Ag—Cu—Ti rises to 820 to 900° C.

On the other hand, the bonding temperature of the ceramic substrate and the copper plate can be made lower by setting the bonding temperature of the active-metal brazing material used to bond the semiconductor element to 800° C. or lower. Consequently, it is possible to avoid adversely affecting a junction layer between the ceramic board and the copper plate by heating treatment in a step of joining the semiconductor element.

Note that if a bonding operation between the ceramic substrate and the copper plate and a bonding operation between the copper plate and the semiconductor element are performed at the same time, it is preferable to use active-metal brazing materials having the same composition.

Examples of the bonding methods when any bonding materials are not interposed include a pressure bonding method, a friction stir welding method (FSW), and a normal temperature bonding method.

The pressure bonding method is a method for bringing the semiconductor element into contact with the semiconductor element-mounting section of the conductor portion and pressing the semiconductor element into the section with a certain pressure thereby to bond the semiconductor element. The semiconductor element may be bonded by pressing in the semiconductor element with a certain pressure while applying heat as necessary. Alternatively, the semiconductor element may be bonded by irradiating the bonding face of the semiconductor element with Ar beams or the like in a vacuum and thereby surface-activating the bonding face.

The friction stir welding method (FSW) is a method for bonding the semiconductor element by pressuring and pressing the semiconductor element against the semiconductor circuit board, while rotating either one of the semiconductor element and the semiconductor circuit board, thereby bonding the semiconductor element by means of frictional heat and stirring force. This method takes advantage of frictional heat and stirring force, and therefore, enables solid-phase junction based on a plastic flow, without melting a base material.

A variety of elements, including an Si element, a GaN element and an SiC element, are applicable to the semiconductor element. In particular, even if a semiconductor element has the operating temperature of which tends to be as high as 130° C. or higher, and even as high as 200° C. or higher is applied, it is possible to improve the reliability of bonding (junction) between the conductor portion and the semiconductor element since the semiconductor element-mounting section of the conductive portion is formed into a planar surface.

In addition, since any unreacted portions and gaps can be prevented from being formed between the semiconductor element and the conductor portion, any portion to serve as a thermal resistive element is not formed in a bonding face. It is therefore possible to efficiently dissipate heat generated from the semiconductor element. Accordingly, methods not involving the interposition of any bonding materials, such as a pressure bonding method, a friction stir welding method and a normal temperature bonding method, are preferred in a case where the semiconductor element the operating temperature of which tends to be high is mounted.

When a semiconductor element is bonded to the semiconductor element-mounting section of the conductive portion without the interposition of any bonding materials, the semiconductor element is preferably bonded by applying a load of 2 kN or higher. As the copper plate, an oxygen-free copper plate is suitably used. The Vickers hardness (HV) of the oxygen-free copper plate is defined by JIS-H-3100 as 55 or higher, and even as 55 to approximately 120. By applying a load of 2 kN or higher, it is possible to precisely press-fit the semiconductor element into the semiconductor element-mounting section of the conductive portion composed of the oxygen-free copper plate, without causing the semiconductor element to incline. Note that the upper limit of the load is preferably 20 kN or lower. An upper limit of the load exceeding 20 kN may cause the copper plate to become deformed. Accordingly, the load is preferably 2 to 20 kN, and more preferably 3 to 10 kN.

For the friction stir welding method, the load can be made lower than 2 kN by applying a motion corresponding to a rotational velocity of 500 to 4000 rpm to the semiconductor element.

Implementing the pressure bonding method or the friction stir welding method under the above-described conditions makes it possible to bond the semiconductor element and the semiconductor element-mounting section of the conductive portion so as not to form any gaps in the bonded portion therebetween. Using an ultrasonic flaw detection method, it is possible to analyze whether or not a gap is formed. Note that the ultrasonic flaw detection method is implemented by a vertical flaw detection method using a pulse reflection method.

In FIGS. 5 to 7, a structure in which only one semiconductor element is mounted is shown as an embodiment. The present invention is not limited this embodiment, however. A plurality of semiconductor elements may be mounted instead. Semiconductor elements tend to be decreased in area in consideration of yields and costs. When a small-sized semiconductor element is mounted, even a minor failure in bonding with a conductor portion causes the semiconductor element to serve as a thermal resistive element, thus affecting heat dissipation. In addition, in order to increase the capacity of a small-area semiconductor element as a semiconductor device, a plurality of semiconductor elements need to be connected in parallel. Even in such a case, the same effect can be obtained by processing a semiconductor element-mounting section of the conductive portion to be mounted with semiconductor elements into a planar surface. Accordingly, the present invention is also suited for a semiconductor device mounted with a plurality of semiconductor elements.

EXAMPLES

Practical Examples 1 to 10 and Comparative Examples 1 to 3

As insulating (ceramic) substrates (30 mm in length×35 mm in width), there were prepared alumina substrates (thickness: 0.635 mm, thermal conductivity: 15 W/m·K, three-point bending strength: 450 MPa), aluminum nitride substrates (thickness: 0.635 mm, thermal conductivity: 180 W/m·K, three-point bending strength: 400 MPa), and silicon nitride substrates (thickness: 0.320 mm, thermal conductivity: 90 W/m·K, three-point bending strength: 650 MPa).

Next, copper plates (25 mm in length×30 mm in width) were bonded to both sides of each insulating substrate by an active-metal brazing material method. Note that as the active-metal brazing material, a brazing material composed of 3 wt % of Ti, 30 wt % of Cu, and Ag for the rest was used, the brazing material was coated to a thickness of 15 μm, and the copper plates were heat-bonded at a temperature of 820 to 860° C. in a vacuum ($10^{-3}$ Pa or lower). As the copper plates, oxygen-free copper plates (Vickers hardness: Hv80) were used.

Next, an etching resist was printed on a front-side copper plate in order to provide a circuit geometry, an etching treatment was performed to form a circuit pattern, and then the etching resist was separated off. In addition, edges of the circuit pattern were etched, as necessary, to adjust the cross-sectional angle θ of the side-surface edges of the copper plate and the protruding region of a bonding layer.

The dimensional specifications of semiconductor circuit boards thus obtained are those of Samples 1 to 8 listed in Table 1.

TABLE 1

| | | Conductor Portion | | | |
|---|---|---|---|---|---|
| Sample No. | Ceramic Substrate | Front Surface (Material × Thickness mm) | Back-Side Surface (Material × Thickness mm) | Cross-Sectional Angle θ of Lateral-Side Edge (°) | Protruding Region of Bonding Layer (mm) |
| Sample 1 | Alumina Substrate | Copper × 0.3 | Copper × 0.3 | 90 | 0 |
| Sample 2 | Alumina Substrate | Copper × 0.6 | Copper × 0.6 | 45 | 0.1 |
| Sample 3 | AlN Substrate | Copper × 0.1 | Copper × 0.1 | 90 | 0 |
| Sample 4 | AlN Substrate | Copper × 0.3 | Copper × 0.3 | 60 | 0.1 |
| Sample 5 | Silicon Nitride Substrate | Copper × 1.0 | Copper × 1.0 | 45 | 0.1 |
| Sample 6 | Silicon Nitride Substrate | Copper × 5.0 | Copper × 5.0 | 30 | 0.2 |
| Sample 7 | Silicon Nitride Substrate | Copper × 10.0 | Copper × 10.0 | 90 | 0.2 |
| Sample 8 | AlN Substrate | Aluminum × 0.1 | Aluminum × 0.1 | 60 | 0 |

Next, with respect to the semiconductor circuit boards denoted as Samples 1 to 8, the semiconductor element-mounting sections were processed to have planar surfaces shown in Table 2. Note that examples in which etching was performed as a polishing processing method were specified as practical examples. In contrast, examples in which no polishing processing was performed were specified as comparative examples.

TABLE 2

| | | Planarity of Semiconductor Element Mounting Section | | | |
|---|---|---|---|---|---|
| Sample No. | Semiconductor Circuit Board | Ra (μm) | Rzjis (μm) | Rz (μm) | Wa (μm) |
| Example 1 | Sample 1 | 0.3 | 2.5 | 2.0 | 0.5 |
| Example 2 | Sample 2 | 0.1 | 2.0 | 1.2 | 0.05 |
| Example 3 | Sample 3 | 0.2 | 2.0 | 1.8 | 0.4 |
| Example 4 | Sample 4 | 0.1 | 1.7 | 1.0 | 0.04 |

TABLE 2-continued

| Sample No. | Semiconductor Circuit Board | Planarity of Semiconductor Element Mounting Section | | | |
|---|---|---|---|---|---|
| | | Ra (μm) | Rzjis (μm) | Rz (μm) | Wa (μm) |
| Example 5 | Sample 5 | 0.1 | 1.5 | 1.0 | 0.03 |
| Example 6 | Sample 6 | 0.3 | 2.5 | 2.0 | 0.5 |
| Example 7 | Sample 6 | 0.1 | 2.0 | 1.0 | 0.3 |
| Example 8 | Sample 6 | 0.1 | 1.5 | 1.0 | 0.02 |
| Example 9 | Sample 7 | 0.1 | 1.5 | 1.0 | 0.3 |
| Example 10 | Sample 7 | 0.1 | 1.3 | 1.0 | 0.02 |
| Example 11 | Sample 8 | 0.3 | 2.4 | 1.8 | 0.5 |
| Comparative Example 1 | Sample 1 | 0.8 | 9.2 | 9.7 | 3.2 |
| Comparative Example 2 | Sample 3 | 0.5 | 3.0 | 2.7 | 5.8 |
| Comparative Example 3 | Sample 5 | 0.4 | 2.5 | 3.0 | 0.8 |
| Comparative Example 4 | Sample 8 | 0.5 | 3.0 | 3.8 | 1.0 |

For semiconductor circuit boards according to Practical Examples 1 to 10 and Comparative Examples 1 to 3, semiconductor elements were mounted on the semiconductor element-mounting sections of conductor portions thereby to fabricate semiconductor devices. The conditions of bonding between the conductor portions and the semiconductor elements are as shown in Table 3. Note that an active-metal brazing material was used as a method involving the interposition of a bonding material, whereas a pressure bonding method or a friction stir welding method (FSW) was used as a method not involving the interposition of a brazing material.

Note that for a bonding method using the active-metal brazing material, an active-metal brazing material composed of 3 wt % of Ti, 20 wt % of Cu, 8 wt % of Sn, 8 wt % of In, and Ag for the rest was used, the brazing material was coated to a thickness of 10 μm, and the semiconductor elements were heat-bonded at a temperature of 700 to 750° C. in a vacuum ($10^{-3}$ Pa or lower). In addition, the pressure bonding method was implemented by applying a load of 3 to 10 kN. Yet additionally, in the friction stir welding method (FSW), semiconductor elements were bonded by applying a load of 1 kN, while rotating the semiconductor elements at a rotational velocity of 1000 to 3000 rpm.

TCT tests (thermal cycle tests) were performed on each semiconductor device thus fabricated. For the TCT tests, a process of −50° C.×30 minutes→room temperature×10 minutes→155° C.×30 minutes→room temperature×10 minutes was defined as one cycle and 2000 cycles were performed as Test 1.

In addition, for samples using a silicon nitride substrate as the ceramic substrate, a process of −50° C.×30 minutes→room temperature×10 minutes→210° C.×30 minutes→room temperature×10 minutes was defined as one cycle and 2000 cycles were performed as Test 2.

After the tests, a verification was made visually or by an ultrasonic flaw detection method whether or not any failure (defect) was present in a bonding between a ceramic substrate and a copper plate and in a bonding between a copper plate and a semiconductor element. Note that as the ultrasonic flaw detection method, a vertical flaw detection method using a pulse reflection method was used to determine semiconductor devices in which no gaps were observed in a bonding between a copper plate and a semiconductor element (a bonding between a semiconductor element and the semiconductor element-mounting section of a copper plate) as acceptable units (defect-free units). Consequently, defect-free units are denoted by "o" and defective units are denoted by "x" in Table 3.

TABLE 3

| Sample No. | Method of Bonding Semiconductor Element | Thermal Cycle Test | | | |
|---|---|---|---|---|---|
| | | Test 1 | | Test 2 | |
| | | Defect in Bonding Between Ceramic Substrate and Copper Plate | Defect in Bonding Between Copper Plate and Semiconductor Element | Defect in Bonding Between Ceramic Substrate and Copper Plate | Defect in Bonding Between Copper Plate and Semiconductor Element |
| Example 1 | Active-Metal Brazing Material | o | o | x | o |
| Example 2 | Pressure Bonding | o | o | x | o |
| Example 3 | Active-Metal Brazing Material | o | o | x | o |
| Example 4 | FSW | o | o | x | o |
| Example 5 | Active-Metal Brazing Material | o | o | o | o |
| Example 6 | Pressure Bonding | o | o | o | o |
| Example 7 | FSW | o | o | o | o |
| Example 8 | Active-Metal Brazing Material | o | o | o | o |
| Example 9 | FSW | o | o | o | o |
| Example 10 | Pressure Bonding | o | o | o | o |
| Example 11 | FSW | o | o | o | o |
| Comparative Example 1 | Active-Metal Brazing Material | o | x | x | x |
| Comparative Example 2 | Active-Metal Brazing Material | o | x | x | x |
| Comparative Example 3 | Pressure Bonding | o | x | o | x |
| Comparative Example 4 | Pressure Bonding | o | x | o | x |

As is evident from the results shown in Table 3 above, a semiconductor device according to each practical example exhibited superior TCT characteristics even in a high-temperature environment of usage of 150° C. or higher, or even 200° C. or higher. In particular, semiconductor devices using a silicon nitride substrate showed excellent characteristics. In addition, in the semiconductor devices according to the practical examples, no gaps were observed in a junction (bonded portion) between a semiconductor element and a copper plate even after the completion of Test 2. Note that although the delamination of copper plates was observed in Test 2 for Practical Examples 1 to 4, the amount of delamination was minor, compared with Comparative Examples 1 and 2.

While several embodiments of the present invention have been described, these embodiments are shown by way of example only and are not intended to limit the scope of the invention. These novel embodiments may be carried out in other various ways, and various omissions, substitutions and modifications may be made therein without departing from the gist of the invention. It should therefore be noted that these embodiments and the modifications thereof fall within the scope or gist of the invention, as well as in the scope of the present invention as defined by the appended claims and equivalents thereof.

REFERENCE SIGNS LIST

1: Semiconductor circuit board (semiconductor device)
2: Insulating substrate
3: Conductor portion (copper circuit plate)
4: Conductor portion (back-side conductor portion, back-side circuit plate)
5: Bonding layer between insulating substrate and conductor portion
6: Protruding region (width) of bonding layer (junction layer)
7: Semiconductor element
8: Bonding layer for bonding semiconductor element
9: Heat sink

The invention claimed is:

1. A semiconductor circuit board in which a conductor portion is provided on an insulating substrate, wherein a surface roughness of a semiconductor element-mounting section of the conductor portion is 0.3 μm or lower in arithmetic average roughness Ra, 2.5 μm or lower in ten-point average roughness Rzjis, 2.0 μm or smaller in maximum height Rz, and 0.5 μm or lower in arithmetic average waviness Wa.

2. The semiconductor circuit board according to claim 1, wherein assuming that a thickness of the insulating substrate is t1 and a thickness of the conductor portion is t2, the thickness of t1 and t2 satisfy a relation: $0.1 \leq t2/t1 \leq 50$.

3. The semiconductor circuit board according to claim 1, wherein a cross-sectional angle of a lateral-side edge of the conductor portion is 45° or smaller.

4. The semiconductor circuit board according to claim 1, wherein the conductor portion is made of a metal plate, whereas the insulating substrate is made of a ceramic substrate, and a region (width) of a bonding layer, for joining the metal plate and the ceramic substrate, protruding from the metal plate is 0.2 mm or smaller.

5. The semiconductor circuit board according to claim 1, wherein the insulating substrate is composed of one of an alumina substrate, an aluminum nitride substrate, a silicon nitride substrate, and an insulating resin substrate.

6. The semiconductor circuit board according to claim 1, wherein the conductor portion is composed of one of copper, copper alloy, aluminum, and aluminum alloy.

7. A semiconductor device in which a semiconductor element is mounted on a conductor portion of a semiconductor circuit board according to claim 1.

8. The semiconductor device according to claim 7, wherein the semiconductor element is composed of one or more than one element selected from a group consisting of an Si element, a GaN element, and an SiC element.

9. The semiconductor device according to claim 7, wherein the semiconductor element is bonded to the conductor portion with a bonding material interposed therebetween.

10. The semiconductor device according to claim 7, wherein the semiconductor element is directly bonded to the conductor portion without a bonding material interposed therebetween.

11. A method for manufacturing a semiconductor circuit board, comprising:
a conductor portion formation step of forming a conductor portion on an insulating substrate;
a surface treatment step of setting a surface roughness of a semiconductor element-mounting section of the conductor portion to 0.3 μm or lower in arithmetic average roughness Ra, 2.5 μm or lower in ten-point average roughness Rzjis, 2.0 μm or smaller in maximum height Rz, and 0.5 μm or lower in arithmetic average waviness Wa; and
a bonding step of bonding a semiconductor element to the semiconductor element-mounting section of the conductor portion.

12. The method for manufacturing a semiconductor circuit board according to claim 11, wherein the surface treatment step is a polishing step.

13. The method for manufacturing a semiconductor circuit board according to claim 12, wherein the polishing step is an etching step.

14. The method for manufacturing a semiconductor circuit board according to claim 12, wherein the polishing step is a pressing process.

* * * * *